United States Patent
Shi et al.

(10) Patent No.: US 10,394,073 B2
(45) Date of Patent: Aug. 27, 2019

(54) COLOR FILM SUBSTRATE, DISPLAY DEVICE AND METHOD FOR MANUFACTURING THE SAME

(71) Applicants: Boe Technology Group Co., Ltd., Beijing (CN); Hefei Boe Optoelectronics Technology Co., Ltd., Heife, Anhui (CN)

(72) Inventors: Gaofei Shi, Beijing (CN); Yijun Wang, Beijing (CN); Jie Song, Beijing (CN); Tianzhen Liu, Beijing (CN); Qinghua Jiang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 234 days.

(21) Appl. No.: 14/912,868

(22) PCT Filed: Aug. 12, 2015

(86) PCT No.: PCT/CN2015/086760
§ 371 (c)(1),
(2) Date: Feb. 18, 2016

(87) PCT Pub. No.: WO2016/134586
PCT Pub. Date: Sep. 1, 2016

(65) Prior Publication Data
US 2016/0370650 A1    Dec. 22, 2016

(30) Foreign Application Priority Data

Feb. 28, 2015   (CN) .......................... 2015 1 0092048

(51) Int. Cl.
*G02F 1/1335* (2006.01)
*C23C 14/08* (2006.01)
(Continued)

(52) U.S. Cl.
CPC ...... *G02F 1/133516* (2013.01); *C23C 14/086* (2013.01); *C23C 14/14* (2013.01);
(Continued)

(58) Field of Classification Search
CPC ...................... G02F 1/133512; G02F 1/13338
See application file for complete search history.

(56) References Cited

U.S. PATENT DOCUMENTS

2009/0096765 A1*  4/2009  Kuo .................... G02F 1/13338
                                                    345/174
2012/0218482 A1*  8/2012  Hwang .................. G06F 3/044
                                                    349/12
(Continued)

FOREIGN PATENT DOCUMENTS

CN    101989160    3/2011
CN    102902390    1/2013
(Continued)

OTHER PUBLICATIONS

Office Action in Chinese Application No. 201510092048.4 dated Jun. 12, 2017, with English translation.
(Continued)

*Primary Examiner* — Michael H Caley
*Assistant Examiner* — Mariam Qureshi
(74) *Attorney, Agent, or Firm* — Womble Bond Dickinson (US) LLP (57) ABSTRACT

The present disclosure relates to a color film substrate, a method for manufacturing the color film substrate, a display device and a method for manufacturing the display device. The color film substrate comprises: a basal substrate; a color
(Continued)

film layer arranged on a side of the basal substrate; a conductive layer arranged on another side of the basal substrate, the conductive layer comprising a plurality of conductive regions; each conductive region comprising a driving channel and an inducing channel; a first gap between the driving channel and the inducing channel in a same conductive region, a second gap between adjacent conductive regions; the first gap and the second gap correspond to a position of a black matrix in the color film layer; the black matrix being used for absorbing light, which light comes from a side of the basal substrate provided with the conductive layer, enters from the first gaps and the second gaps, and passes through the basal substrate. With the solution according to the embodiment of the present invention, the shadow elimination effect of a substrate can be ensured without adding or removing any layer structure for the color film substrate, thereby avoiding impacts on the other performances of the color film substrate.

17 Claims, 3 Drawing Sheets

(51) Int. Cl.
| | | |
|---|---|---|
| C23C 14/14 | (2006.01) | |
| C23C 14/24 | (2006.01) | |
| C23C 14/34 | (2006.01) | |
| C23C 14/58 | (2006.01) | |
| G02B 5/20 | (2006.01) | |
| G03F 7/00 | (2006.01) | |
| G03F 7/20 | (2006.01) | |
| G03F 7/30 | (2006.01) | |
| G06F 3/041 | (2006.01) | |
| G06F 3/044 | (2006.01) | |
| G02B 1/14 | (2015.01) | |
| G02B 5/00 | (2006.01) | |
| G02B 5/30 | (2006.01) | |

(52) U.S. Cl.
CPC .............. *C23C 14/24* (2013.01); *C23C 14/34* (2013.01); *C23C 14/5873* (2013.01); *G02B 5/201* (2013.01); *G02F 1/133512* (2013.01); *G02F 1/133528* (2013.01); *G03F 7/0005* (2013.01); *G03F 7/20* (2013.01); *G03F 7/30* (2013.01); *G06F 3/044* (2013.01); *G06F 3/0412* (2013.01); *G02B 1/14* (2015.01); *G02B 5/003* (2013.01); *G02B 5/3033* (2013.01); *G06F 2203/04103* (2013.01)

(56) References Cited

U.S. PATENT DOCUMENTS

| | | | | |
|---|---|---|---|---|
| 2013/0188103 | A1* | 7/2013 | Jeng | ............... G06F 3/041 349/12 |
| 2014/0168154 | A1* | 6/2014 | Wang | ............... G06F 3/0412 345/174 |
| 2014/0192277 | A1* | 7/2014 | Yilmaz | ............... G06F 3/0412 349/12 |
| 2015/0355489 | A1* | 12/2015 | Takizawa | ............... B32B 5/14 428/212 |
| 2016/0370624 | A1* | 12/2016 | Wang | ............... G02F 1/13338 |

FOREIGN PATENT DOCUMENTS

| | | |
|---|---|---|
| CN | 103049156 | 4/2013 |
| CN | 193472951 A | 12/2013 |
| CN | 103676358 | 3/2014 |
| CN | 104035621 | 9/2014 |
| CN | 104035621 A | 9/2014 |
| CN | 104192578 A | 12/2014 |
| CN | 104199578 | 12/2014 |
| CN | 104597657 | 5/2015 |
| KR | 20040034776 A | 4/2004 |

OTHER PUBLICATIONS

Office Action in Chinese Application No. 201510092048.4 dated Dec. 27, 2016, with English translation. 11 pages.
PCT International Search Report, PCT/CN2015/086760, with English-language translation, 16 pages.

* cited by examiner

COLOR FILM SUBSTRATE, DISPLAY DEVICE AND METHOD FOR MANUFACTURING THE SAME

FIELD OF THE INVENTION

The present invention relates to the field of display technology, particularly to a color film substrate, a method for manufacturing the color film substrate, a display device and a method for manufacturing the display device.

BACKGROUND OF THE INVENTION

"On cell" is the technology that embeds a touch screen between a color filter glass and a polarizer; i.e., touch sensors are arranged on the LCD panel, the driving channels (Tx) and the inducing channels (Rx) are formed with single layer ITO, these two groups of electrodes respectively constituting two poles of a capacitor. When a finger touches the capacitive screen, the coupling between two electrodes near the touch point is affected, thereby changing the capacitance between these two electrodes; in the detection of the mutual capacitance, excitation signals are output from the electrodes in the horizontal direction in turn, all the electrodes in the vertical direction receive signals at the same time; in such a manner, the capacitance values for all the intersection points of the horizontal and vertical electrodes (i.e., the capacitance values for the two-dimensional plane of the whole touch screen) can be obtained. When the finger is close to the touch screen, local capacitance can be reduced; based on the variation data of two-dimensional capacitance of the touch screen, the coordinates of each touch point can be calculated. Thus, even if there are multiple touch points on the screen, the real coordinates of each touch point can be calculated.

However, the impact on the product appearance and performance due to the shadow elimination is an important problem for the SLOC touch screen (in which the touch control material is located over the color filter glass within the LCD layer). In the traditional production structure of the touch screen, there is a reflectivity difference between the ITO pattern region and the non ITO region, therefore the etching marks on the ITO is clearly visible under conventional environment and strong light. In addition, the smoothness of the glass surface is reduced after thinning process, resulting in poor flatness of the ITO film, further increasing the phenomenon of shadow; meanwhile, ITO defects can cause short circuit between the channels, resulting in more defects.

The shadow elimination process for a conventional On Cell product comprises:

1) firstly depositing a layer of silicon dioxide film on a glass substrate as a basal layer with the approach of vacuum magnetron continuous plating; then, depositing a layer of indium tin oxide film on the silicon dioxide film as a conductive film layer by magnetron sputtering; finally, plating a layer of silicon nitride film on the indium tin oxide film as a shadow elimination layer; however, plating a silicon nitride film needs high-temperature film-forming, which is apt to cause bubble problem;

2) firstly plating niobium pentoxide ($Nb_2O_5$) on a glass substrate by magnetron sputtering, forming a niobium pentoxide layer as a shadow elimination layer; then coating a silicon dioxide layer; finally coating a indium tin oxide layer and observing the effect of shadow elimination. The structure is glass+$Nb_2O_5$+$SiO_2$+ITO; in this way, during the production of capacitive touch screen, the square resistance value of indium tin oxide should be in a predetermined range, and the shadow elimination effect should also be ensured. Therefore, after plating niobium pentoxide, the square resistance value of indium tin oxide should be fine tuned to obtain a good shadow elimination effect. With this arrangement, when the shadow elimination effect is qualified, the square resistance value of indium tin oxide may not be up to the standard; or, when the square resistance value of indium tin oxide is up to the standard, the shadow elimination effect may not be qualified. Therefore, the above mentioned process can not give consideration to the square resistance value of indium tin oxide and the shadow elimination effect, the yield being low; it is difficult to meet the market demand.

SUMMARY OF THE INVENTION

It is desired that the shadow elimination effect of a substrate can be ensured with less impact on the other performances of the color film substrate.

To this end, an embodiment of the present invention provides a color film substrate comprising:

a basal substrate; a color film layer arranged on a side of the basal substrate; a conductive layer arranged on another side of the basal substrate, the conductive layer comprising a plurality of conductive regions;

each conductive region comprising a driving channel and an inducing channel;

a first gap between the driving channel and the inducing channel in a same conductive region, a second gap between adjacent conductive regions; the first gap and the second gap correspond to a position of a black matrix in the color film layer;

the black matrix being used for absorbing light, which light comes from a side of the basal substrate provided with the conductive layer, enters from the first gaps and the second gaps, and passes through the basal substrate.

Optionally, the width of the black matrix is greater than or equal to the width of the first gap and the width of the second gap.

Optionally, in a same conductive region, the driving channel surrounds the inducing channel.

Optionally, the color film substrate further comprises:
inducing lead wires arranged corresponding to each conductive region,
wherein the driving channel has a notch; the inducing lead wire is connected to the inducing channel through the notch, conducting an inducing signal generated by the inducing channel.

Optionally, the color film substrate further comprises:
a buffering layer arranged between the conductive layer and the basal substrate.

Optionally, the color film substrate further comprises:
a polarizer arranged on the conductive layer, and a protective layer arranged on the polarizer.

Optionally, each conductive region corresponds to several pixels.

An embodiment of the present invention also provides a display device, the display device comprises the color film substrate as described in any one of the above mentioned embodiments; further comprises:

an array substrate arranged in a manner of box alignment with the color film substrate; and liquid crystal arranged between the color film substrate and the array substrate.

An embodiment of the present invention also provides a method for manufacturing a color film substrate, the method comprises:

forming a color film layer on a side of a basal substrate;

forming a conductive layer on another side of the basal substrate;

performing a composition process to the conductive layer, thereby forming a plurality of conductive regions in the conductive layer;

wherein each conductive region comprises a driving channel and an inducing channel; a first gap between the driving channel and the inducing channel in a same conductive region, and a second gap between adjacent conductive regions correspond to a position of a black matrix in the color film layer, such that the black matrix is used for absorbing light, which light comes from a side of the basal substrate provided with the conductive layer, enters from the first gaps and the second gaps, and passes through the basal substrate.

Optionally, forming a conductive layer comprises:

depositing a conductive layer on another side of the basal substrate by sputtering or thermal evaporation.

Optionally, performing a composition process to the conductive layer comprises:

performing exposure, development and etching to the conductive layer, thereby forming a plurality of conductive regions.

Optionally, a buffering layer is arranged between the conductive layer and the basal substrate.

An embodiment of the present invention further provides a method for manufacturing a display device, comprising:

performing box alignment to the color film substrate manufactured with the method as described in any one of the above mentioned embodiments and an array substrate;

performing a thinning process to the color film substrate and the array substrate after box alignment.

Optionally, performing a thinning process to the color film substrate and the array substrate after box alignment comprises:

performing acid etching, grinding and polishing to the color film substrate and the array substrate after box alignment.

With above mentioned solutions, the black matrix can shield the first gap between the driving channel and the inducing channel in a same conductive region, and the second gap between adjacent conductive regions, such that the black matrix can absorb light, which light comes from a side of the basal substrate provided with the conductive layer, enters from the first gaps and the second gaps, and passes through the basal substrate. It is avoided that light passing through the basal substrate reaches the array substrate, and is reflected to user's eyes from the first gap and the second gap; only a part of light reflected by the basal substrate among the light beams entering from the first gaps and the second gaps can reach user's eyes, thereby reducing the reflectivity difference between the wiring region (the region where the driving channel and the inducing channel are located) and the non-wiring region (the first gaps and the second gaps); in such a manner, the shadow elimination effect of a substrate can be ensured without adding or removing any layer structure for the color film substrate, thereby avoiding impacts on the other performances of the color film substrate.

REFERENCE SIGNS

1—basal substrate; 2—driving channel; 3—inducing channel; 4—first gap; 5—second gap; 6—black matrix; 7—inducing lead wire; 8—buffering layer; 9—polarizer; 10—protective layer; 11—array substrate; 12—liquid crustal.

DETAILED DESCRIPTION OF THE INVENTION

In order to more clearly understand the objects, features and advantages of the disclosure, the technical solutions in embodiments of the invention will be described clearly and completely in connection with the drawings in the embodiments of the invention. It should be explained that, the embodiments of this present invention and the features of the embodiments can be combined with each other without departing the spirit and scope of the invention.

Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Figure 1:
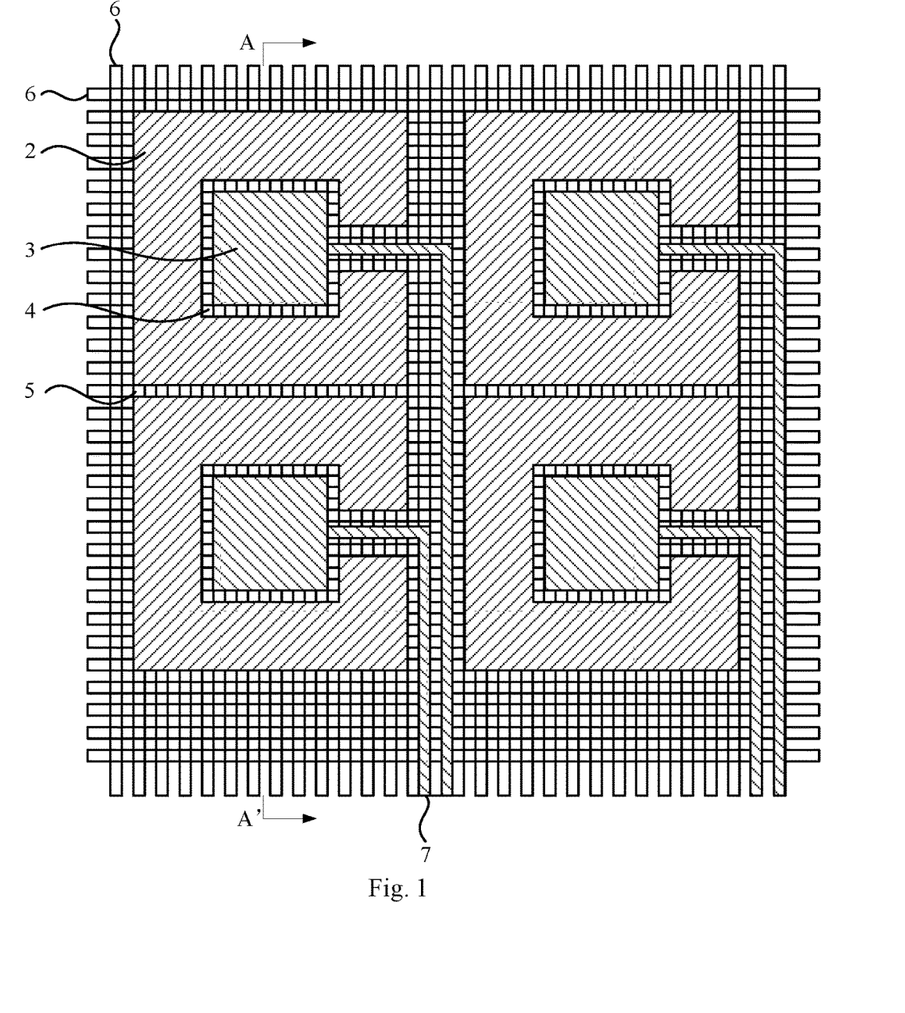
FIG. 1 is a top view of a color film substrate according to an embodiment of the present invention.
Figure 2:
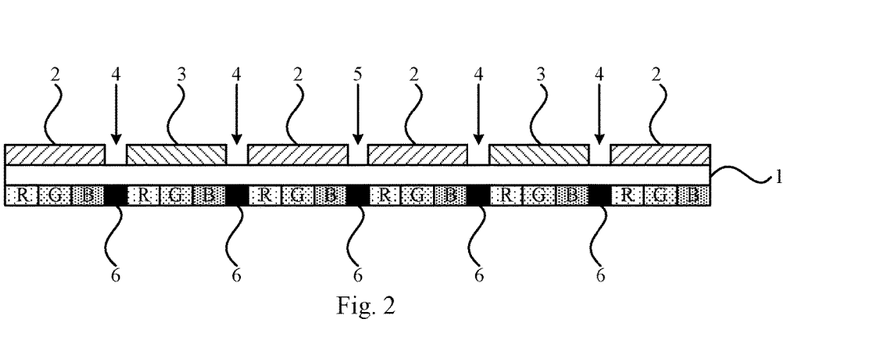
FIG. 2 is a schematic cross section along AA' in the color film substrate of FIG. 1.

As shown in FIG. 1 and FIG. 2, an embodiment of the present invention provides a color film substrate comprising:

a basal substrate 1; a color film layer arranged on a side of the basal substrate 1 and comprising e.g. red, green, blue (RGB) regions and a black matrix 6; a conductive layer arranged on another side of the basal substrate 1, the conductive layer comprising a plurality of conductive regions;

each conductive region comprising a driving channel 2 and an inducing channel 3;

a first gap 4 between the driving channel 2 and the inducing channel 3 in a same conductive region, a second gap 5 between adjacent conductive regions; the first gap 4 and the second gap 5 correspond to a position of the black matrix 6 in the color film layer;

the black matrix 6 being used for absorbing light, which light comes from a side of the basal substrate 1 provided with the conductive layer, enters from the first gaps 4 and the second gaps 5, and passes through the basal substrate 1.

The light entering the color film substrate reaches the conductive layer first, wherein the material of the conductive layer can be transparent conductive layer material, such as indium tin oxide (ITO) or metal. The light incident on the driving channel 2 and inducing channel 3 is reflected, while the light incident on the first gap 4 and the second gap 5 can reach the basal substrate 1; a part of the light is reflected by the basal substrate 1, emitted from the first gap 4 and the second gap 5, another part of the light passes through the basal substrate 1.

Optionally, each conductive region corresponds to several pixels.

In the prior art, the light passing through the basal substrate 1 continues to pass through the color film layer and the liquid crystal 12 under the color film layer, and reach the array substrate 11; the electrode in the array substrate 11 (for example, a common electrode, a pixel electrode) plays a leading role in reflecting the light passing through the basal substrate 1; the light reflected by the array substrate 11 is then emitted from the first gap 4 and the second gap 5. There is a large difference of light intensity between the light reflected by the conductive layer and the light reflected by the array substrate 11, therefore, when these two reflected light beams reach the user's eyes simultaneously, the user's eyes can easily distinguish these two reflected light beams and clearly observe the first gap 4 and the second gap 5. The intuitive perception is that there are squares formed by the conductive regions on the color film substrate, decreasing the user's experience.

According to the solution of the present disclosure, in forming a conductive region on the conductive layer, the first gap 4 and the second gap 5 can be etched such that they correspond to a position of a black matrix 6 in the color film layer; therefore the black matrix 6 can absorb light, which light comes from a side of the basal substrate 1 provided with the conductive layer, enters from the first gaps 4 and the second gaps 5, and passes through the basal substrate 1. The light entering from the first gaps 4 and the second gaps 5 is reflected only by the basal substrate 1. There is a small difference of light intensity between the light reflected by the basal substrate 1 and the light reflected by the conductive layer, therefore, when these two reflected light beams reach the user's eyes simultaneously, the user's eyes can hardly distinguish these two reflected light beams and can not observe the first gap 4 and the second gap 5, thereby ensuring the shadow elimination effect.

Therefore, according to the solution of the present disclosure, in forming the conductive layer, only the first gap 4 and the second gap 5 should be arranged corresponding to the position of the black matrix 6 in the color film layer; there is no needs to add or remove any layer structure for the color film substrate, thereby avoiding impacts on the other performances of the color film substrate Optionally, the width of the black matrix 6 is greater than the width of the first gap 4 and the width of the second gap 5. Further, the width of the black matrix 6 is equal to the width of the first gap 4 and the width of the second gap 5.

The width of the first gap 4 can be arranged equal to the width of the second gap 5, the width of the black matrix 6 can be arranged equal to the width of the first gap 4 and the width of the second gap 5; in such a manner, the black matrix 6 can absorb light, which light comes from a side of the basal substrate 1 provided with the conductive layer, enters from the first gaps 4 and the second gaps 5, and passes through the basal substrate 1; while the width of the black matrix 6 can be as small as possible, thereby providing a large aperture ratio for the color film substrate.

Optionally, as shown in FIG. 1, in a same conductive region, the driving channel 2 surrounds the inducing channel 3. In such a manner, the capacitance between the driving channel 2 and the inducing channel 3 can be increased effectively, thereby improving the sensitivity of inductive touch operation.

Optionally, the color film substrate further comprises:
inducing lead wires 7 arranged corresponding to each conductive region,
wherein the driving channel 2 has a notch (as shown in FIG. 1); the inducing lead wire 7 is connected to the inducing channel 3 through the notch, conducting an inducing signal generated by the inducing channel 3. In such a manner, the inducing signal generated by the inducing channel 3 can be conducted successfully.

Figure 3:
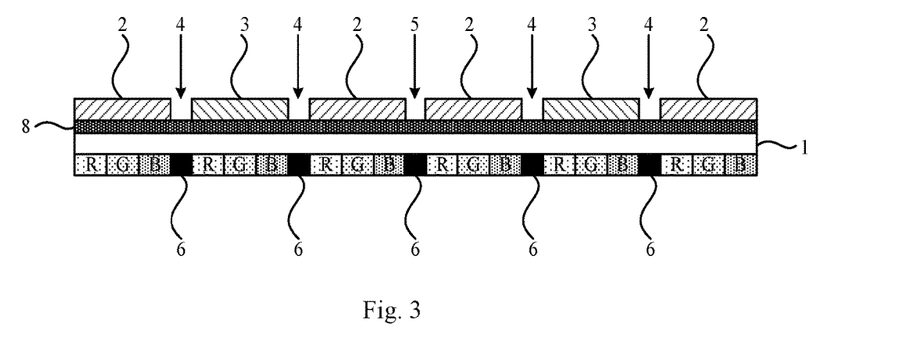
FIG. 3 is a schematic cross section of a color film substrate according to another embodiment of the present invention.

As shown in FIG. 3, optionally, the color film substrate further comprises:
a buffering layer 8 arranged between the conductive layer and the basal substrate.

After performing box alignment to the color film substrate and the array substrate, a thinning process should be performed. However, the thinning process may reduce the smoothness on the side of the basal substrate 1 without the color film. By arranging a buffering layer 8 on this side, the smoothness of the basal substrate 1 can be improved; therefore, a metal layer can be arranged on a surface with a high smoothness, so as to ensure normal wiring of the circuit in the metal layer, reducing defects. In addition, the buffering layer 8 can be made of light transmitting organic resin material such as polyimide, melamine formaldehyde resin, which can match the refractive index difference between the conductive layer (e.g., ITO, with a refractive index of about 1.9) and the basal substrate (e.g., glass, with a refractive index of about 1.5). Moreover, due to the shielding of the black matrix, a reflectivity difference between the ITO pattern region and the non ITO region is then eliminated, thereby improving the shadow elimination effect.

Figure 4:
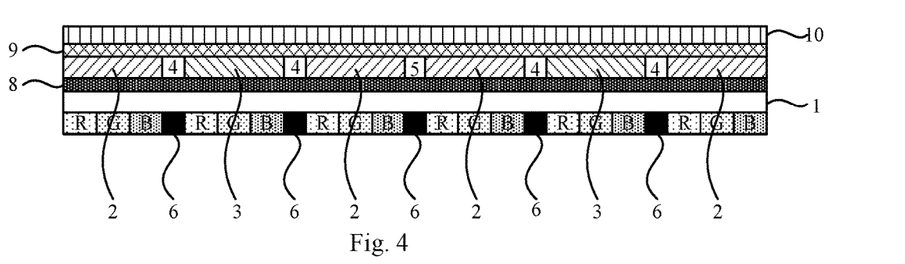
FIG. 4 is a schematic cross section of a color film substrate according to yet another embodiment of the present invention.

As shown in FIG. 4, optionally, the color film substrate further comprises:
a polarizer 9 arranged on the conductive layer, and a protective layer 10 arranged on the polarizer 9.

Figure 5:
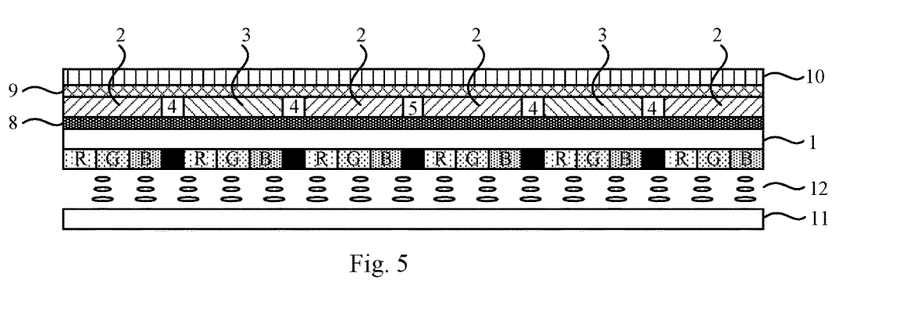
FIG. 5 is a schematic cross section of a display device according to an embodiment of the present invention.

As shown in FIG. 5, an embodiment of the present invention also provides a display device, the display device comprises the color film substrate as described in any one of the above mentioned embodiments; further comprises:
an array substrate 11 arranged in a manner of box alignment with the color film substrate; and liquid crystal 12 arranged between the color film substrate and the array substrate 11.

It should be noted that the display device can be any product or component with display function, such as electronic paper, mobile phone, tablet computer, TV, display, notebook computer, digital photo frame, navigator and so on.

Since the first gap 4 and the second gap 5 correspond to a position of a black matrix 6 in the color film layer, the black matrix 6 can absorb light, which light comes from a side of the basal substrate 1 provided with the conductive layer, enters from the first gaps 4 and the second gaps 5, and passes through the basal substrate 1 (i.e., this part of light can not reach the array substrate). The light entering from the first gaps 4 and the second gaps 5 is thus reflected only by the basal substrate 1. There is a small difference of light intensity between the light reflected by the basal substrate 1 and the light reflected by the conductive layer, therefore, when these two reflected light beams reach the user's eyes simultaneously, the user's eyes can hardly distinguish these two reflected light beams and can not observe the first gap 4 and the second gap 5, thereby ensuring the shadow elimination effect.

Figure 6:
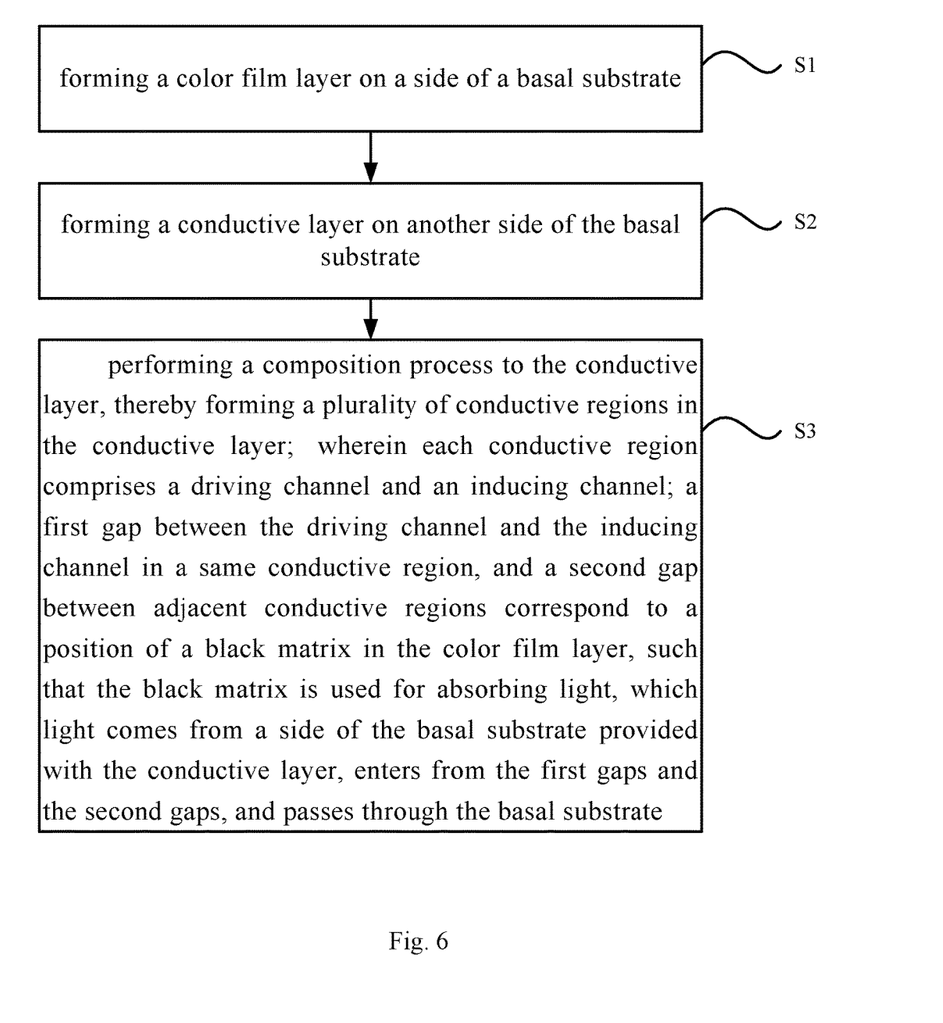
FIG. 6 is a flow chart of a method for manufacturing a color film substrate according to an embodiment of the present invention.

An embodiment of the present invention also provides a method for manufacturing a color film substrate, the method comprises:
S1, forming a color film layer on a side of a basal substrate 1;

S2, forming a conductive layer on another side of the basal substrate 1,

S3, performing a composition process to the conductive layer, thereby forming a plurality of conductive regions in the conductive layer;

wherein each conductive region comprises a driving channel 2 and an inducing channel 3; a first gap 4 between the driving channel 2 and the inducing channel 3 in a same conductive region, and a second gap 5 between adjacent conductive regions correspond to a position of a black matrix 6 in the color film layer, such that the black matrix 6 is used for absorbing light, which light comes from a side of the basal substrate 1 provided with the conductive layer, enters from the first gaps 4 and the second gaps 5, and passes through the basal substrate 1.

Optionally, forming a conductive layer comprises:

depositing a conductive layer on another side of the basal substrate 1 by sputtering or thermal evaporation.

Optionally, performing a composition process to the conductive layer comprises:

performing exposure, development and etching to the conductive layer, thereby forming a plurality of conductive regions.

Optionally, a buffering layer is arranged between the conductive layer and the basal substrate.

The light entering the color film substrate reaches the conductive layer first, wherein the material of the conductive layer can be transparent conductive layer material, such as indium tin oxide (ITO) or metal. The light incident on the driving channel 2 and inducing channel 3 is reflected, while the light incident on the first gap 4 and the second gap 5 can reach the basal substrate 1; a part of the light is reflected by the basal substrate 1, emitted from the first gap 4 and the second gap 5, another part of the light passes through the basal substrate 1.

Optionally, each conductive region corresponds to several pixels.

According to the solution of the present disclosure, in forming a conductive region on the conductive layer, the first gap 4 and the second gap 5 can be etched such that they correspond to a position of a black matrix 6 in the color film layer; therefore the black matrix 6 can absorb light, which light comes from a side of the basal substrate 1 arranged with the conductive layer, enters from the first gaps 4 and the second gaps 5, and passes through the basal substrate 1. The light entering from the first gaps 4 and the second gaps 5 is reflected only by the basal substrate 1. There is a small difference of light intensity between the light reflected by the basal substrate 1 and the light reflected by the conductive layer, therefore, when these two reflected light beams reach the user's eyes simultaneously, the user's eyes can hardly distinguish these two reflected light beams and can not observe the first gap 4 and the second gap 5, thereby ensuring the shadow elimination effect.

Therefore, according to the solution of the present disclosure, in forming the conductive layer, only the first gap 4 and the second gap 5 should be arranged corresponding to the position of the black matrix 6 in the color film layer; there is no needs to add or remove any layer structure for the color film substrate, thereby avoiding impacts on the other performances of the color film substrate Optionally, the width of the black matrix 6 is greater than the width of the first gap 4 and the width of the second gap 5. Further, the width of the black matrix 6 is equal to the width of the first gap 4 and the width of the second gap 5.

The width of the first gap 4 can be arranged equal to the width of the second gap 5, the width of the black matrix 6 can be arranged equal to the width of the first gap 4 and the width of the second gap 5; in such a manner, the black matrix 6 can absorb light, which light comes from a side of the basal substrate 1 arranged with the conductive layer, enters from the first gaps 4 and the second gaps 5, and passes through the basal substrate 1; while the width of the black matrix 6 can be as small as possible, thereby providing a large aperture ratio for the color film substrate.

Optionally, in a same conductive region, the driving channel 2 surrounds the inducing channel 3. In such a manner, the capacitance between the driving channel 2 and the inducing channel 3 can be increased effectively, thereby improving the sensitivity of inductive touch operation.

Optionally, the color film substrate further comprises:

inducing lead wires 7 arranged corresponding to each conductive region, wherein the driving channel 2 has a notch; the inducing lead wire 7 is connected to the inducing channel 3 through the notch, conducting an inducing signal generated by the inducing channel 3. In such a manner, the inducing signal generated by the inducing channel 3 can be conducted successfully.

As shown in FIG. 4, optionally, the color film substrate further comprises:

a polarizer 9 arranged on the conductive layer, and a protective layer 10 arranged on the polarizer 9.

An embodiment of the present invention further provides a method for manufacturing a display device, comprising:

performing box alignment to the color film substrate manufactured with the method as described in any one of the above mentioned embodiments and an array substrate 11;

performing a thinning process to the color film substrate and the array substrate 11 after box alignment.

Optionally, performing a thinning process to the color film substrate and the array substrate 11 after box alignment comprises:

performing acid etching, grinding and polishing to the color film substrate and the array substrate 11 after box alignment.

After performing box alignment to the color film substrate and the array substrate, a thinning process should be performed. However, the thinning process may reduce the smoothness on the side of the basal substrate 1 without the color film. By arranging a buffering layer 8 on this side, the smoothness of the basal substrate 1 can be improved; therefore, a metal layer can be arranged on a surface with a high smoothness, so as to ensure normal wiring of the circuit in the metal layer, reducing defects. In addition, the buffering layer 8 can be made of light transmitting organic resin material such as polyimide, melamine formaldehyde resin, which can match the refractive index difference between the conductive layer (e.g., ITO, with a refractive index of about 1.9) and the basal substrate (e.g., glass, with a refractive index of about 1.5). Moreover, due to the shielding of the black matrix, a reflectivity difference between the ITO pattern region and the non ITO region is then eliminated, thereby improving the shadow elimination effect.

The technical solutions in embodiments of the invention have been described clearly and completely in connection with the drawings in the embodiments of the invention. In the prior art, it is hardly ensured that less impact on the other performances of the color film substrate can be caused while ensuring the shadow elimination effect of a substrate. With above mentioned solutions, the black matrix can shield the first gap between the driving channel and the inducing channel in a same conductive region, and the second gap between adjacent conductive regions, such that the black matrix can absorb light, which light comes from a side of the basal substrate provided with the conductive layer, enters from the first gaps and the second gaps, and passes through the basal substrate. It is avoided that light passing through the basal substrate reaches the array substrate, and is reflected to user's eyes from the first gap and the second gap; only a part of light reflected by the basal substrate among the light beams entering from the first gaps and the second gaps can reach user's eyes, thereby reducing the reflectivity difference between the wiring region (the region where the driving channel and the inducing channel are located) and the non-wiring region (the first gaps and the second gaps); in such a manner, the shadow elimination effect of a substrate can be ensured without adding or removing any layer structure for the color film substrate, thereby avoiding impacts on the other performances of the color film substrate.

It should be pointed out that in the drawings, the size of the layer and region may be exaggerated for the clearness of the graphical representation. It can be understood that when an element or layer is referred as "on" another element or layer, it can be directly located on other element, or there may be an intermediate layer. In addition, it can be understood that when an element or layer is referred as "under" another element or layer, it can be directly located under other element, or there may be more than one intermediate layer or element. In addition, it can also be understood that when a layer or element is referred as "between" two layers or two elements, it can be the only layer between these two layers or two elements, or there may be more than one intermediate layer or element. Throughout the disclosure similar reference signs indicate similar elements.

In the present disclosure, the term "first", "second" and "third" are used only for descriptive purposes, but can not be understood to indicate or imply relative importance. The term "a plurality of" refers to two or more than two, unless otherwise specified.

The above embodiments are only optionally embodiments used for explanations rather than limitations to the present invention, the ordinary skilled person in the related technical field, in the case of not departing from the spirit and scope of the present invention, may also make various modifications and variations, therefore, all the equivalent solutions, equivalent replacement and improvement also belong to the scope of the present invention, the patent protection scope of the present invention should be defined by the claims.

The invention claimed is:

1. A color film substrate, comprising:
    a basal substrate; a color film layer and a black matrix arranged on a side of the basal substrate; a conductive layer arranged on another side of the basal substrate, the conductive layer comprising a plurality of conductive regions;
    each conductive region comprising a driving channel and an inducing channel; and
    a plurality of first gaps and a plurality of second gaps;
    wherein each first gap is located between the driving channel and the inducing channel in each conductive region; each second gap is located between each two adjacent conductive regions;
    and wherein an orthographic projection of the black matrix on the basal substrate completely covers orthographic projections of all the plurality of first gaps and the plurality of second gaps on the basal substrate.

2. The color film substrate as claimed in claim 1, wherein the width of the black matrix is greater than or equal to the width of the first gap and the width of the second gap.

3. The color film substrate as claimed in claim 1, wherein in a same conductive region, the driving channel surrounds the inducing channel.

4. The color film substrate as claimed in claim 3, further comprising:
    inducing lead wires arranged corresponding to each conductive region,
    wherein the driving channel has a notch; the inducing lead wire is connected to the inducing channel through the notch, conducting an inducing signal generated by the inducing channel.

5. The color film substrate as claimed in claim 1, further comprising:
    a polarizer arranged on the conductive layer, and a protective layer arranged on the polarizer.

6. The color film substrate as claimed in claim 1, wherein each conductive region corresponds to several pixels.

7. A display device, comprising the color film substrate as claimed in claim 1; further comprising:
    an array substrate arranged in a manner of box alignment with the color film substrate; and liquid crystal arranged between the color film substrate and the array substrate.

8. The display device as claimed in claim 7, wherein the width of the black matrix is greater than or equal to the width of the first gap and the width of the second gap.

9. The display device as claimed in claim 7, wherein in a same conductive region, the driving channel surrounds the inducing channel.

10. The display device as claimed in claim 7, further comprising:
    a polarizer arranged on the conductive layer, and a protective layer arranged on the polarizer.

11. The display device as claimed in claim 7, wherein each conductive region corresponds to several pixels.

12. A method for manufacturing the color film substrate as claimed in claim 1, comprising:
    forming a color film layer and a black matrix on a side of a basal substrate;
    forming a conductive layer on another side of the basal substrate;
    performing a composition process to the conductive layer, thereby forming a plurality of conductive regions, a plurality of first gaps and a plurality of second gaps in the conductive layer;
    wherein each conductive region comprises a driving channel and an inducing channel; each first gap is located between the driving channel and the inducing channel in each conductive region; each second gap is located between each two adjacent conductive regions; an orthographic projection of the black matrix on the basal substrate completely covers orthographic projections of all the plurality of first gaps and the plurality of second gaps on the basal substrate.

13. The method as claimed in claim 12, wherein forming a conductive layer comprises:
    depositing a conductive layer on another side of the basal substrate by sputtering or thermal evaporation.

14. The display device as claimed in claim 13, further comprising:
    inducing lead wires arranged corresponding to each conductive region,
    wherein the driving channel has a notch; the inducing lead wire is connected to the inducing channel through the notch, conducting an inducing signal generated by the inducing channel.

15. The method as claimed in claim 12, wherein performing a composition process to the conductive layer comprises:
   performing exposure, development and etching to the conductive layer, thereby forming a plurality of conductive regions.

16. A method for manufacturing a display device, comprising:
   manufacturing a color film substrate according to the method claimed in claim 12;
   performing box alignment to the color film substrate and an array substrate;
   performing a thinning process to the color film substrate and the array substrate after box alignment.

17. The method for manufacturing a display device as claimed in claim 16, wherein performing a thinning process to the color film substrate and the array substrate after box alignment comprises:
   performing acid etching, grinding and polishing to the color film substrate and the array substrate after box alignment.

* * * * *